United States Patent [19]
Moore, Jr.

[11] Patent Number: 5,346,410
[45] Date of Patent: Sep. 13, 1994

[54] FILTERED CONNECTOR/ADAPTOR FOR UNSHIELDED TWISTED PAIR WIRING

[75] Inventor: Alston C. Moore, Jr., Boulder Creek, Calif.

[73] Assignee: Tandem Computers Incorporated, Cupertino, Calif.

[21] Appl. No.: 76,028

[22] Filed: Jun. 14, 1993

[51] Int. Cl.⁵ .......................................... H01R 13/658
[52] U.S. Cl. ...................................... 439/607; 333/12; 333/181; 439/610
[58] Field of Search .................. 333/12, 181; 439/607, 439/610, 620

[56] References Cited

U.S. PATENT DOCUMENTS

| | | | |
|---|---|---|---|
| 3,879,691 | 4/1975 | Fritz | 439/607 X |
| 4,374,369 | 2/1983 | Sakamoto et al. | 333/12 X |
| 4,636,752 | 1/1987 | Saito | 333/181 X |
| 5,023,585 | 6/1991 | Kurano et al. | 333/181 X |
| 5,109,206 | 4/1992 | Carlile | 333/12 X |
| 5,189,382 | 2/1993 | Kauffman | 333/181 X |
| 5,236,376 | 8/1993 | Cohen | 439/620 |

OTHER PUBLICATIONS

*Steward Ferrites for EMI Suppression,* Jun. 1991 product guide (cover page, index page, pp. 3-7 and 41-45).

Primary Examiner—Paul Gensler
Attorney, Agent, or Firm—Towsend and Townsend Khourie and Crew

[57] ABSTRACT

Twisted wire pairs are used to interconnect units of a data processing system with connectors that incorporate electromagnetic interference suppression devices in the form of common mode ferrite choke.

13 Claims, 1 Drawing Sheet

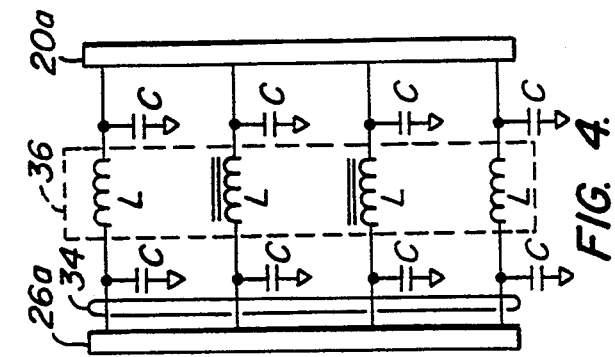
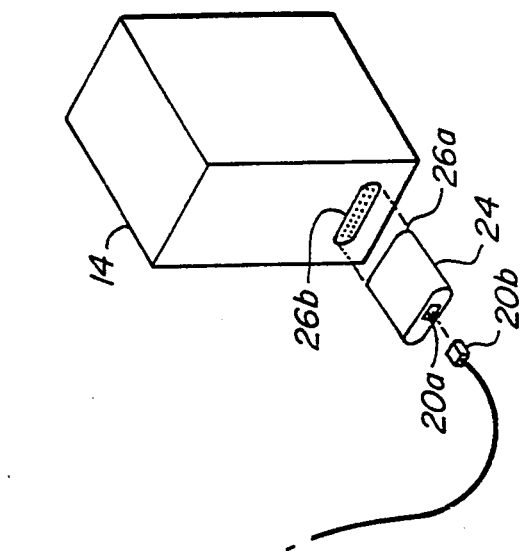
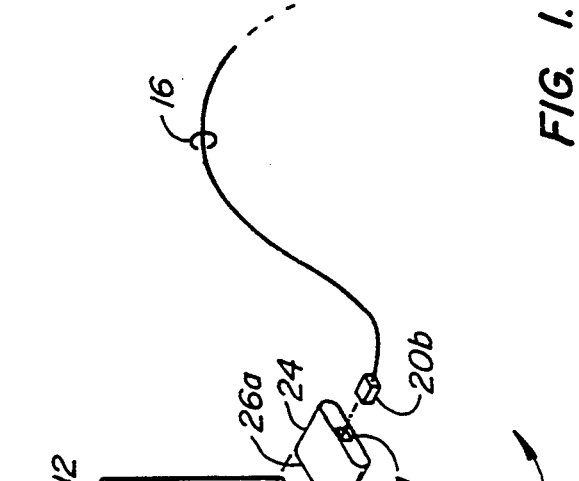
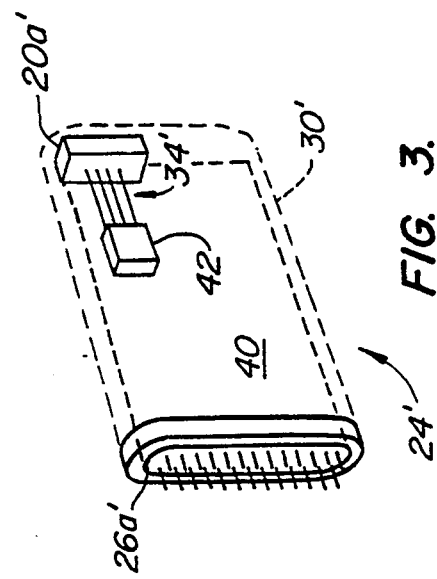
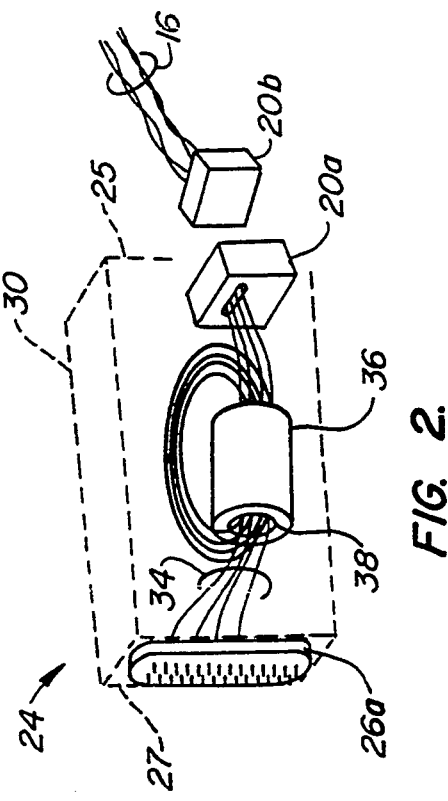

FILTERED CONNECTOR/ADAPTOR FOR UNSHIELDED TWISTED PAIR WIRING

BACKGROUND OF THE INVENTION

The present invention is directed generally to electromagnetic interference noise suppression. More particularly, the invention concerns connector structure that suppresses, to an acceptable level, emanation of any electromagnetic interference radiation onto unshielded wiring used to interconnect elements of a data processing system.

As the clock rates of today's data processing systems increase, so do the problems of attenuating or suppressing electromagnetic interference noise radiated by the equipment of the systems. Suppression techniques include shielding the equipment by properly constructed enclosures. When, as is often the case, the data processing system is made up of several separate data processing units (e.g., a host processor to which is coupled a plurality of workstations, printers, disk storage units, and the like), the wiring that is used to interconnect the data processing pieces can act as an antenna to carry out and radiate electromagnetic interference noise that may be produced by the interconnected units.

Recognizing the problems that can be created by such radiation, the Federal Communications Commission (FCC) and other (international) agencies have set standards limiting the amount of electromagnetic interference radiation that equipment can produce. Manufacturers of data processing systems, therefore, presently make every attempt to design their systems with electromagnetic interference noise radiation suppression in mind. Thus, cabinets and enclosures for data processing systems are designed, for example, to act both as a shield and to form a connecting point for DC returns. Signalling communicated from a unit of the system to another is carried by shielded wiring. Although these techniques are effective, problems continue to exist.

One problem is that the use of shielded wiring is costly, particularly when considered for use in large data processing networks (e.g., local area networks), both in terms of expense of the wiring itself, and the labor to install the network interconnections. Perhaps more importantly, local area networks are often preferably installed with the interconnect wiring part of the building construction in order to preclude the wiring from being exposed in travelled areas. Frequently, buildings, particularly those that may be newly constructed, will have installed twisted-wire pair wiring for telephones or for local area network interconnections. In order to comply with FCC (and other) limits on electromagnetic radiation limits, the twisted-wire pair wiring must be removed in favor of replacement with shielded wiring. Now, the expense includes the structural modifications encountered in such replacement, a not particularly attractive approach.

One solution has been to attach ferrite beads on the wiring, near each of the connectors. This solution finds some attenuation of the EMI noise, but not always enough.

Accordingly, there is a need for a form of EMI noise suppression in use in connection with unshielded twisted wire pairs used to interconnect data processing equipment.

SUMMARY OF THE INVENTION

The present invention is directed to filtered connector/adaptors that can connect units of a data processing system in a networking configuration using unshielded wires while at the same attenuating the electromagnetic interference (EMI) emissions that may otherwise be carried out from the particular unit to acceptable emissions levels.

Broadly, the invention comprises a connector/adaptor constructed to include signal wiring to communicate with the data processing unit over unshielded twisted wire pairs. The signal wiring is passed through a common mode ferrite choke, contained in the connector, to effectively attenuate excessive EMI originating from the data processing unit.

In one embodiment of the invention the filtered connector is constructed to convert a conventional serial (RS232) connection to current loop format.

Among the advantages of the invention is that the filtered connector/adaptor can be used to install data processing equipment using unshielded twisted-wire pair wiring, while enjoying EMI noise suppression with very little effort. Further, the unshielded twisted wire pair wiring that may already be in place in the building, can be used with the knowledge that EMI noise suppression is achieved to acceptable emissions levels.

These and other advantages and features of the present invention will become apparent to those skilled in the art upon a reading of the following detailed description, which should be taken in conjunction with the accompanying drawings.

BRIEF DESCRIPTION OF THE DRAWINGS

FIG. 1 is an illustration of two elements of a data processing system interconnected by unshielded twisted pair wiring and connectors constructed according to the present invention;

FIG. 2 is an illustration of one of the connectors shown in FIG. 1, constructed according to the teachings of the present invention;

FIG. 3 is an illustration of an alternate embodiment of the connector of the present invention, showing its use as an RS232 to current loop adaptor;

FIG. 4 is a schematic diagram of an alternate embodiment of the invention, illustrating the addition of capacitive elements.

DESCRIPTION OF THE PREFERRED EMBODIMENT

FIG. 1 simplistically illustrates a data processing system, designated generally with a reference numeral 10, and comprising a host processor 12 interconnected to a peripheral unit 14 by interconnect wiring 16. Data processing system 10 could be, for example, a local area network consisting of a multiplicity of data separate processing units (e.g. a host processor, printers, workstations, and the like), only two of which (host processor 12 and peripheral unit 14) of which are shown for reasons of simplicity. However, as will become apparent, and appreciated, by those skilled in this art, application of the present invention will not be limited by the number of elements interconnected in the network.

Continuing with FIG. 1, the interconnect wiring 16 is a twisted-wire pair (or pairs) such as typically used in local area network configuration. The ends of the connective wire 16 have attached an RJ-45 connector parts 20b, 20b that are received by mating connector parts 20a, 20a carried by the two similarly constructed connectors 24. (The connectors 24 differ only in pin-outs; i.e., which pins of the connector connect to which wires—a point not pertinent to the understanding or operation of the present invention. Thus, for the purposes of this discussion, the connectors are considered identical, which they are insofar as the invention is concerned.) The connectors 24 also carry connector parts 26a that are received by mating connector parts 26b, 26b carried by processor host 12 and remote unit 14.

Turning now to FIG. 2, the connector 24 of the present invention is shown as comprising a non-metallic housing 30 that carries the connector parts 20a, 26a at the opposite ends 25, 27 thereof.

For the purposes of this discussion it is assumed that the connections to the host processor 12 and peripheral unit 14 is a serial (RS232) connection (as would typically be found in local area network configurations). Thus, the connector parts 26a, 26b would most likely be a DB25 connector. It is also assumed that only four of the RS232 signals (including a return) are being used, so that the interconnect wiring 16 need consist of only four wires: two twisted-wire pairs.

Four connector wires 34 electrically communicate the connector parts 20b, 26b to one another. The connector wires 34 are looped about a toroidal-shaped ferrite 36 (i.e., the connector wires are passed through the aperture 38 of the ferrite 36 twice) before connecting the connector wires to the connector parts 20a, 26a. In this manner the ferrite 36 forms a common mode ferrite choke that effectively attenuates any electromagnetic interference emissions to acceptable levels communicated from the connector part 26b (i.e., from host processor 12 or the peripheral unit 14) to the connector 24 and onto the interconnect wiring 16.

Only one loop through the ferrite 36 is shown in FIG. 2, and in most instances this may be all that is necessary. However, as discussed further below, the wires may be looped through the ferrite 36 an additional number of times (e.g. two or more) for additional noise suppression.

In operation, the connector 24, constructed as shown in FIG. 2, adapts a DB25 type connector to a RJ-45 type connector, and provides EMI suppression. Each of a pair of connectors are respectively connected to the host processor 12 and the remote unit 14. The connector parts 20b, 20b carried by the interconnect wiring 16 are releasably connected to the connectors 24. Much of the electromagnetic interference emissions that may emanate onto the connector wiring 34 from the host 12 (or peripheral 14) will be converted by the ferrite 36 to heat. Any EMI emission reaching the interconnect wiring 16 is reduced by the ferrite 36 to an acceptable level.

An alternate embodiment of the invention is used in connection with an RS232 to current loop converter. As is well known, current loop devices allow data processing system units to be spaced farther apart (i.e., the interconnect wiring 16 longer) by providing additional current for the data signals that drive the interconnect wiring 16 (FIG. 1). Illustrated in FIG. 3 is a connector 24' of substantially similar construction to that shown in FIG. 2, including a housing 30', and connector parts 20a' and 26a'. However, in place of the wiring 34 (FIG. 2) the connector 24' carries a circuit board 40 that would, for example, carry the necessary driver circuitry (not shown) for converting RS232 signals to current loop signals. The circuit board 40 also carries a printed circuit board mountable ferrite 42 that connects the current loop circuitry (not shown) to signal lines 34', and to the connector part 20a'. The ferrite 42 is constructed to form a common mode ferrite choke to operate in the same manner as the ferrite 36 discussed in connection with FIG. 2. Such surface mountable ferrite components are available from Steward of East 36th Street, Chattanooga, Tenn. 37401, part number 28F0430-S0.

There may be instances, particularly when the invention is used in connection with current-loop circuitry, when the ferrite 36 (or ferrite 42) may not be enough to suppress electromagnetic emissions to acceptable levels. In such instances, capacitors can be added. FIG. 4 schematically illustrates the ferrite 36 (represented in FIG. 4 as inserted inductances L in connector wires 34) with the addition of capacitors C. As FIG. 4 shows, each of the wires 34 is coupled to a common (e.g., chassis ground of the unit with which the connector unit is used) by two capacitors C, one on each side of the ferrite 35. When used with AWG 22 size wiring, capacitors C having a value of approximately 68 picofarads were found to lower the emission levels acceptably.

It is believed, however, that the capacitors C can be eliminated, and the higher emission levels still suppressed to acceptable levels, by increasing the number of turns of the wiring 34 through the ferrite 26 (FIG. 2). With ferrites a turns-squared benefit is achieved up to about 3 to 5 turns. It is believed that an extra turn (i.e., two full turns, rather than just the one turn shown in FIG. 2) will eliminate the capacitors C.

What is claimed is:

1. A connector for coupling an electronic apparatus, to unshielded wiring, the electronic apparatus being of a type that can incidentally produce electromagnetic interference (EMI) that may be communicated to the unshielded wiring to which the electronic apparatus is coupled, the connector comprising:

a non-metallic housing;

first means mounted in the housing for connecting the connector to the electronic apparatus;

second means mounted in the housing for connecting the connector to the unshielded wiring;

connector wiring for electrically communicating said first and second means to one another; and suppression means associated with the connector wiring forming a common mode filter to attenuate common mode EMI radiation resulting from communication of the incidental EMI to the connector wiring from the electrical apparatus.

2. The connector of claim 1, wherein the suppression means comprises a toroidal-shaped ferrite having an aperture formed therethrough with the connector wiring passing through the aperture of the toroidal-shaped ferrite at least twice.

3. The connector of claim 1, wherein the suppression means includes a toroidal-shaped ferrite having an aperture formed to receive the connector wiring therethrough a plurality of times so that the connector wiring is looped about the toroidal-shaped ferrite to form a common mode choke.

4. The connector of claim 3, wherein the unshielded wiring includes twisted-pair wiring.

5. The connector of claim 3, wherein the connector wiring is passed through the aperture of the toroidal-shaped three times forming two turns therethrough.

6. A connector for attenuating electromagnetic interference from an electronic unit coupled to a remote unit by at least unshielded interconnect wiring that communicates electrical signals between the electronic unit and the remote unit, the electronic unit having a first connector part for attachment to the connector, and the unshielded wiring having a second connector part for attachment to the connector, the connector comprising:

a housing;

mating third and fourth connector parts mounted in the housing for connection to the first and second connector parts, respectively;

electrical wiring coupled to communicate the electrical signals between the mating third and fourth connector parts; and common mode choke means formed on the electrical wiring to attenuate the electromagnetic interference radiation communicated to the electrical wiring from the electronic unit.

7. The connector of claim 6, wherein the common mode choke means comprises a toroidal-shaped ferrite, the electrical wiring being passed through the toroidal-shaped ferrite at least twice so that the electrical wiring is looped about the toroidal-shaped ferrite.

8. The connector of claim 6, wherein the common mode choke means comprises a toroidal-shaped ferrite, the electrical wiring being passed through the toroidal-shaped ferrite a plurality of times so that the electrical wiring is looped about the toroidal-shaped ferrite.

9. The connector of claim 8, wherein the electrical wiring is passed through the toroidal-shaped three times forming two turns therethrough.

10. The connector of claim 8, wherein the housing is non-metallic.

11. The connector of claim 6, wherein the unshielded interconnect wiring includes twisted-pair wiring.

12. A connector for attenuating electromagnetic interference from an electronic unit coupled to a remote unit by at least unshielded interconnect wiring that communicates electrical signals between the electronic unit and the remote unit, the electronic unit having a first connector part for attachment to the connector, and the unshielded wiring having a second connector part for attachment to the connector, the connector comprising:

a housing;

mating third and fourth connector parts mounted in the housing for connection to the first and second connector parts, respectively;

electrical wiring, including a plurality of individual electrical wires, coupled to communicate the electrical signals between the mating third and fourth connector parts;

common mode choke means formed on the electrical wiring to attenuate the electromagnetic interference radiation communicated to the electrical wiring from the electronic unit, the electrical wiring being passed through the toroidal-shaped ferrite at least twice so that the electrical wiring is looped about the toroidal-shaped ferrite; and capacitive means coupling each one of the plurality of electrical wires to an electrical common.

13. The connector of claim 12, wherein the capacitive means coupled each of the plurality of electrical wires to the electrical common at a point of ingress to and a point of egress from the toroidal-shaped ferrite.

* * * * *